United States Patent [19]

Lorimer et al.

[11] Patent Number: 6,068,685
[45] Date of Patent: May 30, 2000

[54] SEMICONDUCTOR MANUFACTURING SYSTEM WITH GETTER SAFETY DEVICE

[75] Inventors: D'Arcy H. Lorimer, Pismo Beach; Charles H. Applegarth, San Luis Obispo, both of Calif.

[73] Assignee: SAES Pure Gas, Inc., San Luis Obispo, Calif.

[21] Appl. No.: 08/950,929

[22] Filed: Oct. 15, 1997

[51] Int. Cl.$^7$ ................................ B01D 53/04
[52] U.S. Cl. .................. 96/112; 96/117.5; 96/154
[58] Field of Search .................. 96/112, 117.5, 96/151, 154; 95/116, 127, 130, 138

[56] References Cited

U.S. PATENT DOCUMENTS

| | | |
|---|---|---|
| 3,536,522 | 10/1970 | Cecil et al. . |
| 4,816,043 | 3/1989 | Harrison .................... 96/112 |
| 4,832,711 | 5/1989 | Christel, Jr. et al. ........ 96/112 |
| 4,895,580 | 1/1990 | Morioka et al. ............ 96/112 |
| 4,941,894 | 7/1990 | Black ........................ 96/112 |
| 5,172,066 | 12/1992 | Succi et al. . |
| 5,238,469 | 8/1993 | Briesacher et al. ......... 95/115 |
| 5,393,329 | 2/1995 | Imagaki et al. ............ 96/154 |
| 5,505,825 | 4/1996 | Gold et al. ................. 96/112 |

FOREIGN PATENT DOCUMENTS

| | | |
|---|---|---|
| 0 438 036 A2 | 12/1990 | European Pat. Off. . |
| 28 43 627 | 4/1980 | Germany ................... 96/112 |
| 590003 | 1/1978 | U.S.S.R. .................... 96/112 |
| 2 177 079 | 1/1987 | United Kingdom . |
| 2 177 080 | 1/1987 | United Kingdom . |

*Primary Examiner*—C. Scott Bushey
*Attorney, Agent, or Firm*—Hickman Stephens & Coleman, LLP

[57] ABSTRACT

A semiconductor manufacturing system includes a getter-based gas purifier coupled in flow communication with a gas distribution network for a semiconductor fabrication facility. The gas distribution network supplies purified gas to at least one wafer processing chamber in the semiconductor fabrication facility. The gas purifier includes a getter column having a metallic vessel with an inlet, an outlet, and a containment wall extending between the inlet and the outlet. Getter material which purifies gas flowing therethrough by sorbing impurities therefrom is disposed in the vessel. A first temperature sensor is disposed in a top portion of the getter material. The first temperature sensor is located in a melt zone to detect rapidly the onset of an exothermic reaction which indicates the presence of excess impurities in the incoming gas to be purified. A second temperature sensor is disposed in a bottom portion of the getter material. The second temperature sensor is located in a melt zone to detect rapidly the onset of an exothermic reaction which indicates that excess impurities are being backfed into the getter column. First and second high melting point, nonmetallic liners are disposed in the vessel such that at least some of the top and bottom portions, respectively, of the getter material is separated from the containment wall of the vessel. A getter-based gas purifier, a method of making an integrated circuit device, and a method of protecting a getter column are also described.

34 Claims, 7 Drawing Sheets

SEMICONDUCTOR MANUFACTURING SYSTEM WITH GETTER SAFETY DEVICE

CROSS REFERENCE TO RELATED APPLICATIONS

This application is related to U.S. patent application Ser. No. 09/174,055, filed Oct. 15, 1998, entitled SAFETY SYSTEM FOR GAS PURIFIER by inventors Marco Succi, Giorgio Vergani, and D'Arcy H. Lorimer and to U.S. patent application Ser. No. 09/172,972, filed Oct. 14, 1998, entitled SEMICONDUCTOR MANUFACTURING SYSTEM WITH GETTER SAFETY DEVICE by inventors D'Arcy H. Lorimer and Charles H. Applegarth, the disclosures of which are incorporated herein by reference for all purposes. This application is further related to U.S. patent application Ser. No. 09/252,023, filed Feb. 16, 1999, and U.S. patent application Ser. No. 09/335,801, filed Jun. 17, 1999, both divisions from the present application.

BACKGROUND OF THE INVENTION

The present invention relates generally to the production of semiconductor devices and, more particularly, to semiconductor manufacturing systems including a getter-based gas purifier with a safety device.

Modern semiconductor manufacturing systems use ultra-pure gases to produce high density semiconductor devices. One way of providing such ultrapure gases is through the use of a getter-based gas purifier. This type of gas purifier typically includes a getter column which has a vessel containing a bed of getter material. The getter material purifies gas flowing therethrough by adsorbing impurities from the gas.

Getter columns are hazardous because the getter material contained therein is highly reactive with high concentrations of impurities. For example, in the event a high concentration, e.g., a few percent depending on the gas flow rate, of an impurity, e.g., oxygen, is introduced into a getter column containing a known zirconium-based getter material, an exothermic reaction occurs the heat from which may cause melting of the containment wall of the vessel. The containment wall, which is typically formed of stainless steel, may melt at temperatures as low as about 1,000° C. because the getter material contacting the containment wall reacts therewith and forms a eutectic composition. If melting of the containment wall results in the formation of a hole therein, then breach of containment of the getter material occurs, which is potentially catastrophic.

One known getter-based gas purifier for purifying argon includes an alarm device for protecting the getter column from breach of containment of the getter material. This alarm device includes a thermocouple element located three inches below the top of the bed of getter material. Existing getter columns do not have a thermocouple at the bottom of the bed. When a control unit coupled to the thermocouple element measures a temperature of 450° C., which is 50° C. above the normal operating temperature of this getter column, the control unit actuates isolation valves which isolate the getter column, i.e., shut off the flow of gas into and out of the getter column. Unfortunately, the alarm device typically does not stop the flow of high impurity gas into the getter column in time to prevent the getter column from sustaining substantial damage caused by overheated getter material contacting the stainless steel walls of the vessel. Thus, the alarm device does not reliably protect the getter column from breach of containment of the getter material.

In view of the foregoing, there is a need for a safety device for getter-based gas purifiers which reliably protects against breach of containment of the getter material in the event high concentrations of impurities are introduced into a getter column. There is also a need for a semiconductor manufacturing system which includes a getter-based gas purifier having such a safety device so that the fabrication facility in which such system is installed is protected from damage which may result from catastrophic failure of a getter column.

SUMMARY OF THE INVENTION

Broadly speaking, the present invention fills these needs by providing a getter-based gas purifier with a safety device which reliably protects against breach of containment of the getter material in the event high concentrations of impurities are introduced into a getter column. The safety device rapidly detects the onset of an exothermic reaction which occurs when excess impurities come into contact with getter material, protects a vessel in which the getter material is disposed by inhibiting the formation of a eutectic composition between the getter material and a containment wall of the vessel, and safely shuts down the getter column before breach of the vessel.

In one aspect of the present invention, a semiconductor manufacturing system is provided. The semiconductor manufacturing system includes a getter-based gas purifier coupled in flow communication with a gas distribution network for a semiconductor fabrication facility. The gas distribution network supplies purified gas to at least one wafer processing chamber in the semiconductor fabrication facility. The gas purifier includes a getter column having a metallic vessel with an inlet, an outlet, and a containment wall extending between the inlet and the outlet. Getter material which purifies gas flowing therethrough by sorbing impurities therefrom is disposed in the vessel. A first temperature sensor is disposed in a top portion of the getter material. The first temperature sensor is located in a predicted "melt zone" to detect rapidly the onset of an exothermic reaction which indicates the presence of excess impurities in the incoming gas to be purified. A second temperature sensor is disposed in a bottom portion of the getter material. The second temperature sensor is located in the predicted melt zone to detect rapidly the onset of an exothermic reaction which indicates that excess impurities are being backfed into the getter column.

In a preferred embodiment, the getter column further includes a first high melting point, nonmetallic liner disposed in the vessel such that at least some of the top portion of the getter material is separated from the containment wall of the vessel and a second high melting point, nonmetallic liner disposed in the vessel such that at least some of the bottom portion of the getter material is separated from the containment wall of the vessel. The first and second high melting point, nonmetallic liners are preferably comprised of a ceramic material, e.g., quartz, zirconia ($ZrO_2$), SiC, SiN, and $Al_2O_3$.

In another aspect of the present invention, a getter-based gas purifier is provided. The getter-based gas purifier includes a getter column having a metallic vessel with an inlet, an outlet, and a containment wall extending between the inlet and the outlet. The vessel has getter material disposed therein. A first isolation valve and a vent valve are in flow communication with the inlet of the vessel. A second isolation valve is in flow communication with the outlet of the vessel. First and second temperature sensors are disposed in the top and bottom portions, respectively, of the getter material. A control unit is coupled to the first and second temperature sensors, the first and second isolation valves, and the vent valve. The control unit measures temperatures sensed by the first and second temperature sensors. When a temperature above a first alarm temperature is measured, the control unit actuates the first and second isolation valves to isolate the getter column. When a temperature above a second alarm temperature is measured, the control unit actuates the vent valve to vent gas from the getter column. The vent valve permits the removal of pressurized gaseous impurities causing the exothermic reaction from above the melt zone. This process is facilitated by the pressurized purified gas (e.g. Argon) contained by the previously operating getter column which helps purge the gaseous impurities through the vent valve.

In a preferred embodiment, the first isolation valve is in flow communication with a source of feed gas to be purified, the second isolation valve is in flow communication with an outlet for purified gas, and the gas purifier further includes a bypass valve in flow communication with the source of feed gas and the outlet for purified gas. The control unit opens the bypass valve when a temperature above the first alarm temperature is measured. When a temperature above a third alarm temperature is measured, the control unit closes the bypass valve.

The first alarm temperature is preferably about 10° C. to about 100° C., more preferably about 40° C. to about 60° C., and most preferably about 50° C., above a normal operating temperature of the getter column. The second alarm temperature is preferably at least about 100° C. above the normal operating temperature of the getter column. The third alarm temperature is preferably at least about 200° C., and more preferably at least about 300° C., above the normal operating temperature of the getter column.

In a further aspect of the present invention, a method of making an integrated circuit device is provided. In this method a gas is purified in a getter-based gas purifier with a safety device to obtain a purified gas. The purified gas is supplied to at least one wafer processing chamber in a semiconductor fabrication facility. A semiconductor wafer is processed in the at least one wafer processing chamber to obtain an integrated circuit device.

In a still further aspect of the present invention, a method of protecting a getter column is provided. In this method a getter column having a metallic vessel with getter material disposed therein is provided. A first temperature is measured in a top portion of the getter material. A second temperature is measured in a bottom portion of the getter material. When either the first or second temperature reaches a first alarm temperature which is higher than a normal operating temperature of the getter column, the getter column is isolated. When either the first or second temperature reaches a second alarm temperature which is higher than the first alarm temperature, the getter column is vented.

In a preferred embodiment, the first temperature is measured from just above 0 inch to just below 3 inches below a top surface of the getter material, with a preferred range being from about 0.5 inch to about 2.5 inches, and a more preferred range being from about 1 inch to about 2 inches. The second temperature is measured from just above 0 inch to just below 3 inches above a bottom surface of the getter material, with a preferred range being from about 0.5 inch to about 2.5 inches, and a more preferred range being from about 1 inch to about 2 inches.

These and other features and advantages of the present invention will become apparent upon reading the following detailed description and studying the various figures of the drawings.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

The preferred embodiments of the present invention will now be described in detail with reference to the accompanying drawings.

Figure 1:
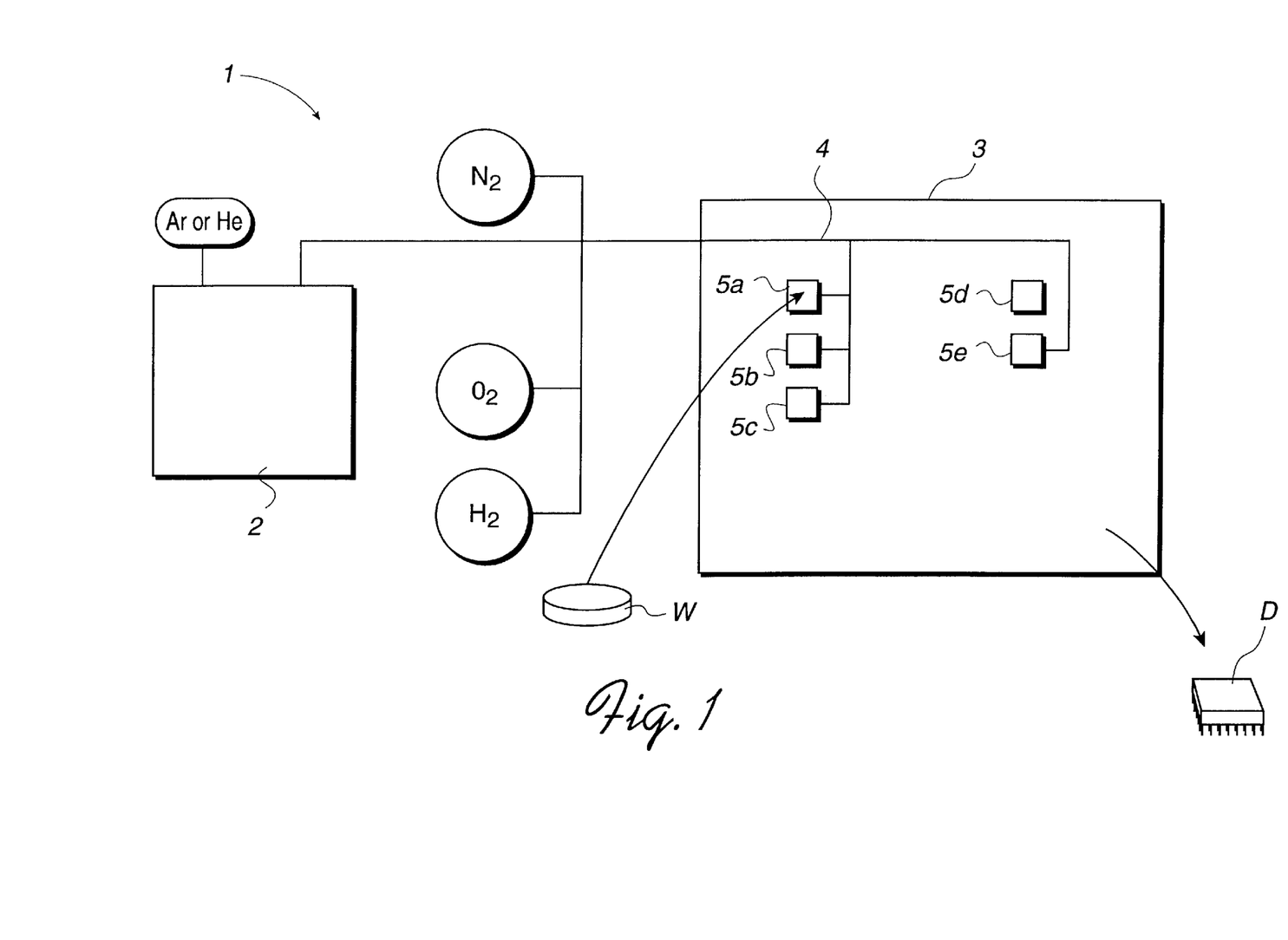
FIG. 1 shows a schematic diagram of a semiconductor manufacturing system formed in accordance with one embodiment of the present invention.

FIG. 1 shows semiconductor manufacturing system 1 formed in accordance with one embodiment of the present invention. Semiconductor manufacturing system 1 includes getter-based gas purifier 2, which will be described in more detail later, for purifying a noble gas, e.g., Ar and He, to an ultrapure level. Semiconductor fabrication facility 3 includes gas distribution network 4 for supplying gas to wafer processing chambers 5a, 5b, 5c, 5d, and 5e. Semiconductor fabrication facility 3 is maintained under appropriate cleanroom conditions, as is known to those skilled in the art. Gas distribution network 4 is in flow communication with an outlet for purified gas of gas purifier 2 and sources of other gases used in semiconductor manufacturing processes, e.g., $N_2$, $O_2$, and $H_2$. The purified gas from gas purifier 2 is used to process semiconductor wafer W in one or more of wafer processing chambers 5a, 5b, 5c, 5d, and 5e to obtain integrated circuit device D. The processes conducted in wafer processing chambers 5a, 5b, 5c, 5d, and 5e in which ultrapure Ar or He may be used include, for example, chemical vapor deposition, physical vapor deposition, and ion implantation. These processes are well known to those skilled in the art.

Figure 2:
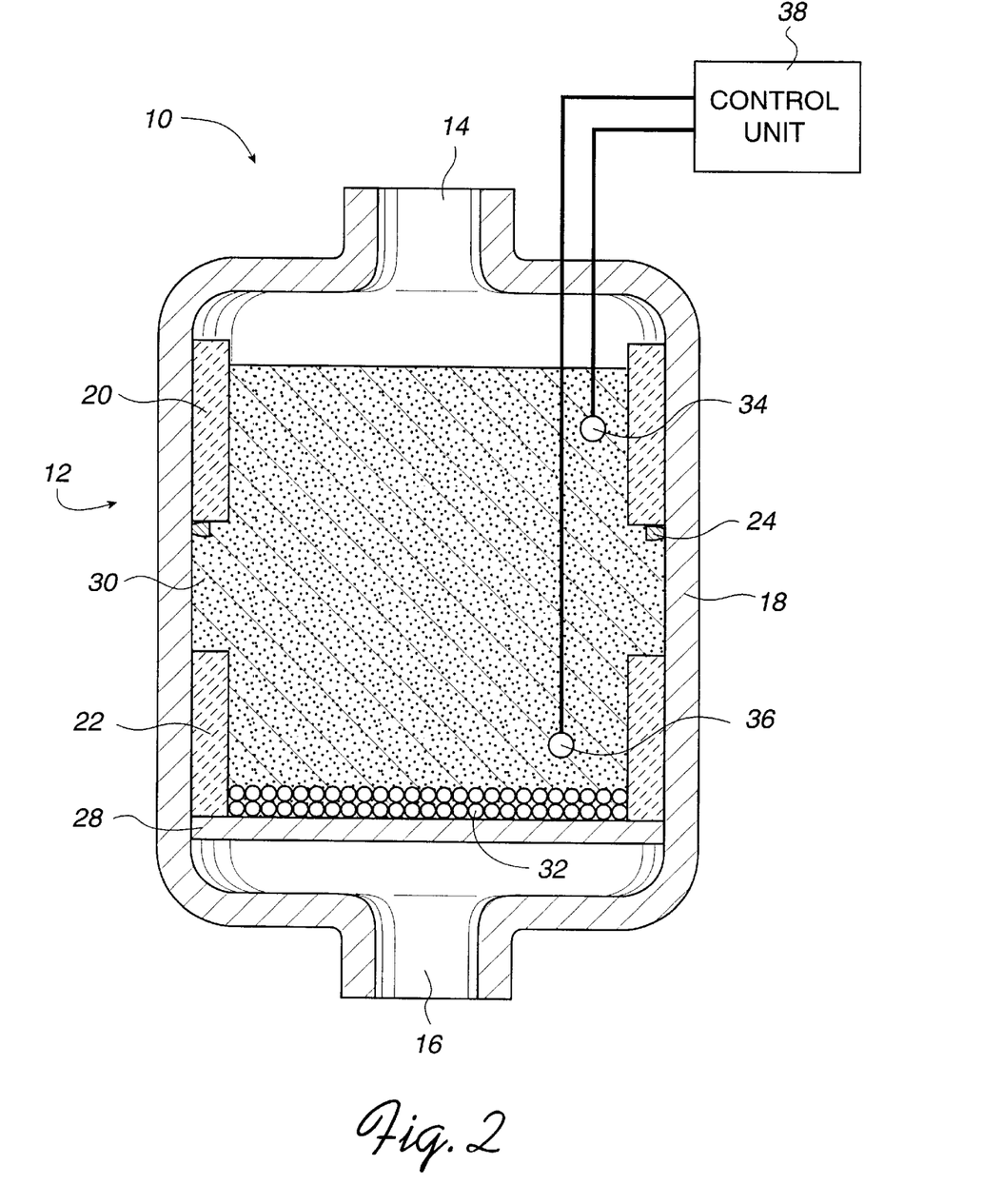
FIG. 2 shows a cross-sectional view of a getter column formed in accordance with one embodiment of the present invention.

FIG. 2 shows getter column 10 formed in accordance with one embodiment of the present invention. Getter column 10 includes vessel 12 having an inlet 14, an outlet 16, and a containment wall 18 extending between inlet 14 and outlet 16. Vessel 12 preferably has a generally cylindrical configuration and may be made from any suitable material having sufficient strength and high temperature resistance, e.g., metallic materials. In a preferred embodiment, vessel 12 is formed of stainless steel, e.g., 316 stainless steel.

Liners 20 and 22 are disposed within vessel 12. Liners 20 and 22 have a substantially cylindrical shape with an outer diameter that substantially coincides with an inner diameter of vessel 12. Liner 20 is secured in an upper portion of vessel 12 by spring-loaded clip 24 which frictionally engages containment wall 18. Those skilled in the art will recognize that other techniques may be used to hold liner 20 in place, e.g., welded tabs or a spring-loaded ring mounted in a groove formed in containment wall 18. Liner 22 is supported in a lower portion of vessel 12 by bed support 28. Liners 20 and 22 may be made from any suitable high melting point, nonmetallic material capable of thermally insulating and protecting containment wall 18 of vessel 12 from damage, as will be explained in more detail later. Liners 20 and 22 are preferably made from a ceramic material such as quartz, zirconia ($ZrO_2$), SiC, SiN, and $Al_2O_3$. In a preferred embodiment, liners 20 and 22 are made from quartz.

Getter bed 30 is disposed within vessel 12 to facilitate gas purification. When gas to be purified flows through getter bed 30, the getter material forming bed 30 sorbs impurities from the gas and thereby purifies the gas, as is known to those skilled in the art. Commercially available getter materials appropriate for the gas being purified are suitable for forming getter bed 30. The getter material forming getter bed 30 may be in the form of pellets, pills, powder, granules, or other suitable shape. By way of example, preferred getter materials for purifying noble gases such as Ar and He are sold by SAES Getters S.p.A. of Milan, Italy, under the trade designations St 707™ and St 101®. The St 707™ alloy has a composition of 70 wt % Zr, 24.6 wt % V, and 5.4 wt % Fe. The St 101® alloy has a composition of 84 wt % Zr and 16 wt % Al.

Bed support 28 supports getter bed 30 within vessel 12. Bed support 28 is preferably a porous plate comprised of a metallic material, e.g., stainless steel. Bed support 28 may be secured within vessel 12 by any suitable technique, e.g., welding. Those skilled in the art will recognize that bed support 28 may also serve as a particulate filter if it is formed of a sintered material.

Barrier material 32 is disposed above bed support 28 and separates getter bed 30 from bed support 28. Barrier material 32 may be any suitable material capable of protecting bed support 28 from substantial damage, as will be explained in more detail later. Preferred barrier materials include, but are not limited to, metallic materials, e.g., stainless steel, and ceramic materials, e.g., quartz, SiC, SiN, and $Al_2O_3$. The barrier material is preferably in the form of relatively small diameter particles having a substantially spherical shape, e.g., balls, or an assortment of generally cylindrical and generally spherical shapes, e.g., shot. In a preferred embodiment, barrier material 32 is comprised of stainless steel shot having a diameter of 0.125 inch to 0.25 inch.

Temperature sensors 34 and 36 are disposed in getter bed 30. Temperature sensor 34 is disposed in a top portion of getter bed 30 and temperature sensor 36 is disposed in a bottom portion of getter bed 30. Temperature sensors 34 and 36 are coupled to control unit 38, the operation of which will be described in more detail later. In a preferred embodiment, temperature sensors 34 and 36 are thermocouple elements. The use of fast-acting thermocouple elements with a thin sheath is preferred for quicker response time. The thermocouple elements may be disposed in a single sheath or in separate sheaths. Those skilled in the art will recognize that other temperature sensing devices, e.g., a platinum resistance temperature device (RTD) or a thermistor, also may be used.

In operation, preheated gas to be purified enters getter column 10 through inlet 14. The gas is preheated to a temperature in the range of from about 300° C. to about 400° C. by a pre-heater (shown in FIG. 7) which, in accordance with conventional practice, may be integral with getter column 10. The gas then flows through getter bed 30, barrier material 32, and bed support 28. As the gas flows through getter bed 30, the getter material forming bed 30 sorbs impurities from the gas. The purified gas exits getter column 10 through outlet 16.

In the event gas which contains a high concentration of impurities, e.g., oxygen, nitrogen, or oxygen-containing gases such as CO, $CO_2$, and $H_2O$, enters getter column 10, an exothermic reaction occurs when the gas contacts the getter material forming getter bed 30. Such high impurity gas may enter getter column 10 through either inlet 14 or outlet 16. For example, high impurity gas may enter through inlet 14 if getter column 10 is inadvertently connected to an improper source of gas. High impurity gas may enter through outlet 16 as the result of backfeeding which may occur if gas facility lines for, e.g., argon and nitrogen, are cross-connected. If high impurity gas enters through inlet 14, then liner 20 protects the portion of containment wall 18 adjacent thereto from substantial damage during the exothermic reaction by separating the getter material from that portion of containment wall 18. If high impurity gas enters through outlet 16, then liner 22 protects the portion of containment wall 18 adjacent thereto from substantial damage during the exothermic reaction by separating the getter material from that portion of containment wall 18. The getter material is separated from containment wall 18 to prevent the getter material from reacting therewith to form a ferrous eutectic composition (when containment wall 18 is formed of a ferrous material such as, for example, stainless steel). The formation of this eutectic composition should be prevented because such composition melts at the high temperatures (on the order of 1,000° C.) reached during the exothermic reaction and, consequently, may cause catastrophic failure by melting a hole in containment wall 18. The purpose of the barrier material 32 is to buffer the stainless steel support 28 from the melt zone area above it, thereby saving the support 28 from destruction.

Figure 3:
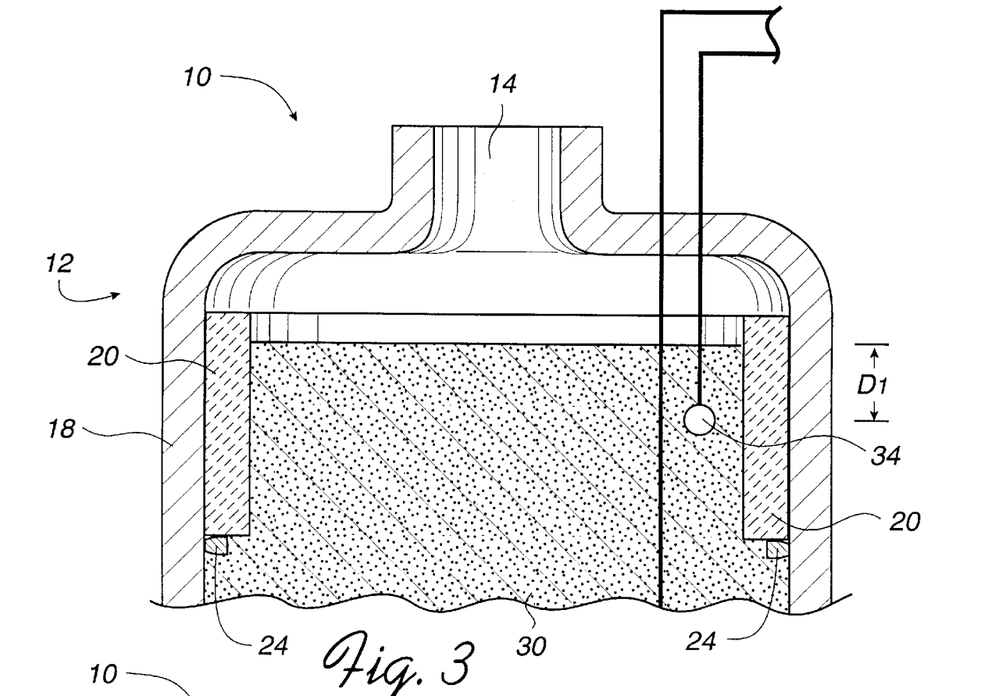
FIG. 3 shows a cross-sectional view of the upper portion of the getter column shown in FIG. 1.

FIG. 3 shows the upper portion of getter column 10. The upper portion of getter column 10 is configured to inhibit the formation of a eutectic composition between the getter material and containment wall 18 and to detect rapidly the onset of an exothermic reaction which indicates the presence of excess impurities in the incoming gas to be purified. As shown in FIG. 3, liner 20 is disposed in vessel 12 such that one end extends a short distance, e.g., about 0.25 inch to about 0.5 inch, above the top surface of getter bed 30 to ensure that the getter material is separated from containment wall 18. The other end of liner 20 is embedded in getter bed 30. The length of liner 20 is selected so that the liner covers a melt zone, which will be described in more detail later, while being as short as possible. The length of the liner is kept as short as possible to avoid providing a path for the gas to be purified which bypasses the getter material. The use of a relatively short liner also minimizes any problems which may be caused by the difference in the coefficients of thermal expansion for liner 20 and vessel 12. In a standard 5 inch diameter vessel, liner 20 preferably has a length of about 3 inches to about 5 inches and a thickness of about 0.125 inch. Those skilled in the art will recognize that these preferred dimensions are a function of the geometry of the vessel and the gas flow rate.

As further shown in FIG. 3, temperature sensor 34 is located at a point which is a distance D, below the top of getter bed 30. The point at which temperature sensor 34 is located is selected to fall within a melt zone. As used in connection with the description of the invention, the term "melt zone" means the region in which the maximum temperature generated by the exothermic reaction between an impurity and the getter material occurs the fastest. It has been discovered that when high impurity gas enters getter column 10 through inlet 14 the maximum temperature generated by the exothermic reaction occurs the fastest below the top surface of getter bed 30. It is believed that the maximum temperature occurs below the top surface of getter bed 30 because the exothermic reaction is not instantaneous and because of the gas velocity of the incoming gas. For normal flow rates, e.g., 1 cubic meter/hour/kilogram of getter material, the distance $D_1$ has been found to be about 1 inch for virgin getter material to about 2.5 inches for aged getter material. Thus, the melt zone moves deeper into the bed as the getter material ages. Furthermore, for lower gas flow rates, the distance $D_1$ may be slightly shorter because of the reduced gas velocity of the incoming gas. If the gas inlet provides for uniform distribution of the incoming gas, then the melt zone will normally be located in the center of the getter material. On the other hand, if the gas inlet provides for nonuniform distribution of the incoming gas, e.g., an annular distribution, then the melt zone may be offset from the center of the getter material.

Those skilled in the art will recognize that the location of the melt zone is a function of certain parameters including the geometry of the getter column, e.g., the diameter and the length of the vessel, the gas flow rate, the type of impurity, and the age of the getter material. Depending on these parameters, it is believed that the melt zone may occur from just above 0 inch to about 6 inches below the top of getter bed 30. In a standard 5 inch diameter vessel at a normal gas flow rate, temperature sensor 34 is preferably located from just above 0 inch to just below 3 inches below the top surface of getter bed 30, with a more preferred range being from about 0.5 inch to about 2.5 inches and a most preferred range being from about 1 inch to about 2 inches.

Figure 4:
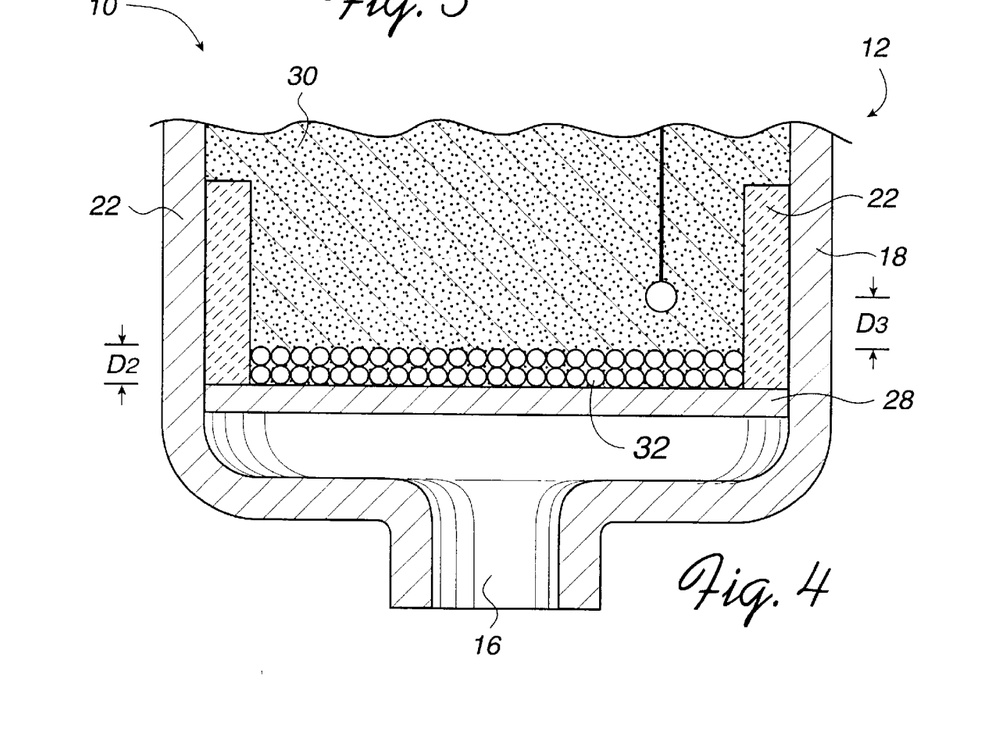
FIG. 4 shows a cross-sectional view of the lower portion of the getter column shown in FIG. 1.

FIG. 4 shows the lower portion of getter column 10. The lower portion of getter column 10 is configured to inhibit the formation of a eutectic composition between the getter material and either containment wall 18 or bed support 28 and to detect rapidly the onset of an exothermic reaction which indicates that excess impurities are being backfed into getter column 10. As shown in FIG. 4, liner 22 is disposed in vessel 12 such that one end rests on bed support 28 and the other end is embedded in getter bed 30. The length and thickness of liner 22 may be the same as the length and thickness of liner 20, as discussed above in connection with FIG. 3. Barrier material 32 separates the getter material at the bottom of getter bed 30 from bed support 28. The thickness $D_2$ of barrier material 32 is selected to protect bed support 28 from substantial damage by inhibiting the formation of a eutectic composition between the getter material and bed support 28 so that such eutectic composition does not melt a hole therethrough. When barrier material 32 is a layer of stainless steel shot, a thickness $D_2$ of about 1 inch has been found to be sufficient to protect bed support 28 from substantial damage.

As further shown in FIG. 4, temperature sensor 36 is located at a point which is a distance $D_3$ above the bottom of getter bed 30. The point at which temperature sensor 36 is located is also selected to fall within a melt zone, i.e., the region in which the maximum temperature generated by the exothermic reaction between an impurity and the getter material occurs the fastest. It has been discovered that when high impurity gas enters getter column 10 through outlet 16, e.g., by backfeeding from a cross-connected gas facility line, the maximum temperature generated by the exothermic reaction occurs the fastest above the bottom surface of getter bed 30. It is believed that the maximum temperature occurs above the bottom surface of getter bed 30 because the exothermic reaction is not instantaneous and because of the gas velocity of the incoming gas. In tests in which $N_2$ was backfed into a standard 5 inch diameter vessel at a gas flow rate of >20 m³/hr, the distance $D_3$ has been found to be about 1.5 inches to about 2 inches. As discussed above in connection with the description of FIG. 3, the location of the melt zone depends on certain parameters including the geometry of the getter column, e.g., the diameter and the length of the vessel, the gas flow rate, and the type of impurity. Depending on these parameters, it is believed that the melt zone may occur from just above 0 inch to about 6 inches above the bottom of getter bed 30. In a standard 5 inch diameter vessel, temperature sensor 36 is preferably located from just above 0 inch to just below 3 inches above the bottom surface of getter bed 30, with a more preferred range being from about 0.5 inch to about 2.5 inches and a most preferred range being from about 1 inch to about 2 inches.

Figure 5:
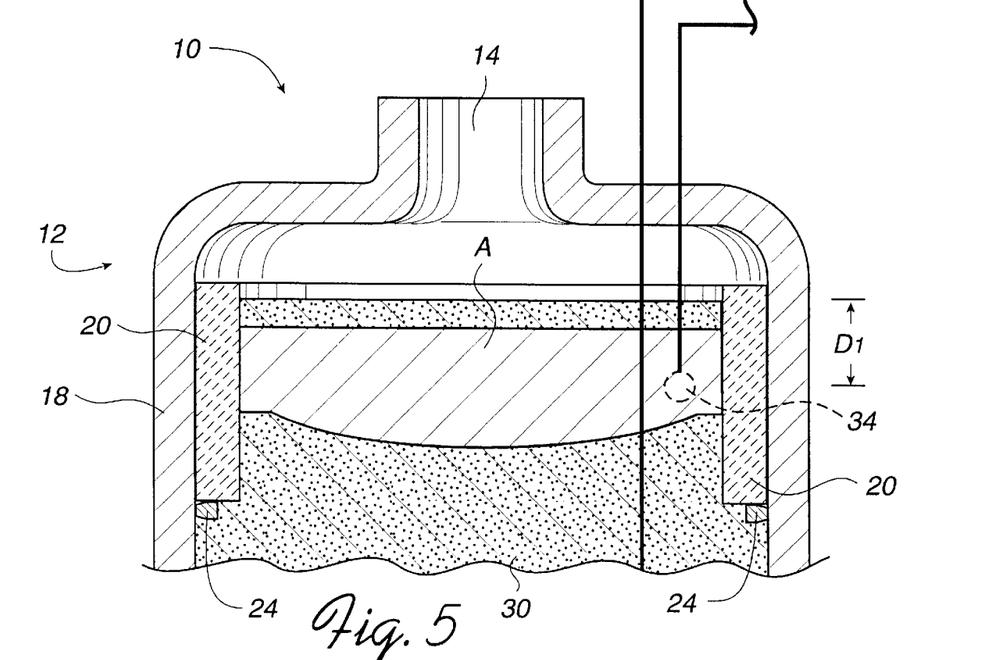
FIG. 5 illustrates a cross-sectional view of the structure of the upper portion of the getter column shown in FIG. 3 after high impurity gas has entered the getter column through an inlet thereof.

FIG. 5 illustrates the structure of the upper portion of getter column 10 after high impurity gas has entered getter column 10 through inlet 14. As can be seen in FIG. 5, melt zone A is formed below the top surface of getter bed 30. Melt zone A forms because the heat from the exothermic reaction which occurs when the high impurity gas contacts the getter material forming getter bed 30 initiates a melt process in the getter material. Liner 20 protects the portion of containment wall 18 adjacent thereto from substantial damage during the melt process. In particular, liner 20 separates melt zone A from containment wall 18 and thereby inhibits the formation of a eutectic composition between the molten getter material and containment wall 18. Temperature sensor 34 is shown as a dotted line in FIG. 5 to indicate that the sensor, e.g., thermocouple element, has been destroyed in the melt process.

Figure 6:
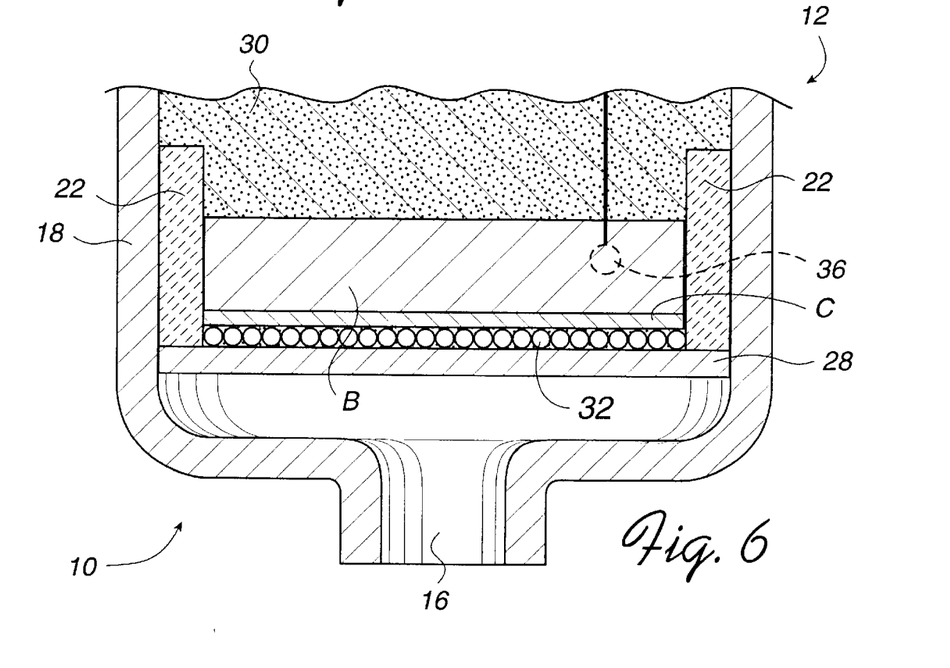
FIG. 6 illustrates a cross-sectional view of the structure of the lower portion of the getter column shown in FIG. 4 after high impurity gas has entered the getter column through an outlet thereof.

FIG. 6 illustrates the structure of the lower portion of getter column 10 after high impurity gas has getter column 10 through outlet 16, e.g., by backfeeding from a cross-connected gas facility line. As can be seen in FIG. 6, melt zone B and eutectic melt zone C are formed at the bottom of getter bed 30. Eutectic melt zone C is formed between melt zone B and barrier material 32 which in this preferred embodiment is shown as a layer of stainless steel shot. Melt zone B forms because the heat from the exothermic reaction which occurs when the high impurity gas contacts the getter material forming getter bed 30 initiates a melt process in the getter material. Eutectic melt zone C forms when melt zone B reacts with the stainless steel shot in contact therewith and forms a ferrous eutectic composition which melts at the high temperatures (on the order of 1,000° C.) reached during the exothermic reaction. Eutectic melt zone C does not advance completely through barrier material 32, i.e., the layer of stainless steel shot, because the melting of additional stainless steel beyond that in immediate contact with melt zone B has a dilution effect which ultimately stops the formation of the ferrous eutectic composition before bed support 28 is reached. Thus, barrier material 32 protects bed support 28 from substantial damage by preventing the getter material from reacting therewith and forming a ferrous eutectic composition which may melt a hole therethrough. Liner 22 protects the portion of containment wall 18 adjacent thereto from substantial damage during the melt process. In particular, liner 22 separates melt zone B and melt zone C from containment wall 18 and thereby inhibits the formation of a eutectic composition between either the molten getter material or the molten eutectic composition and containment wall 18. Temperature sensor 36 is shown as a dotted line in FIG. 6 to indicate that the sensor, e.g., thermocouple element, has been destroyed in the melt process.

Figure 7:
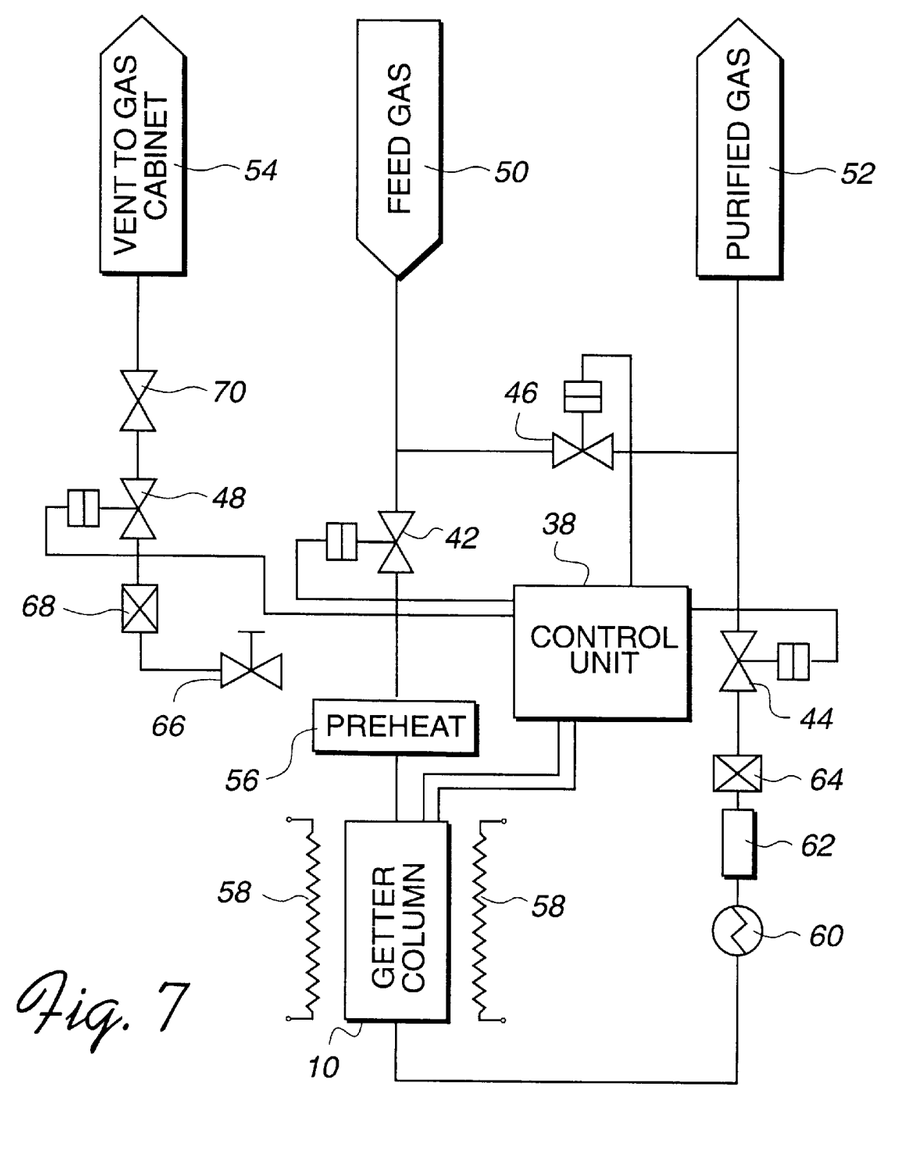
FIG. 7 is a schematic diagram of a getter-based gas purifier formed in accordance with one embodiment of the present invention.

FIG. 7 is a schematic diagram of getter-based gas purifier 2 formed in accordance with one embodiment of the present invention. As shown therein, gas purifier 2 includes getter column 10, control unit 38, isolation valves 42 and 44, bypass valve 46, and vent valve 48. Getter column 10 preferably has the configuration shown in FIG. 1. Isolation valves 42 and 44, bypass valve 46, and vent valve 48 are preferably air actuated valves. Isolation valve 42 is in flow communication with an inlet of getter column 10, e.g., inlet 14 shown in FIG. 1, and a source 50 of feed gas to be purified. Isolation valve 44 is in flow communication with an outlet of getter column 10, e.g., outlet 16 shown in FIG. 1, and an outlet 52 for purified gas which may be connected to a gas distribution network for, e.g., a semiconductor fabrication facility. Bypass valve 46 is in flow communication with source 50 and outlet 52. Vent valve 48 is in flow communication with the inlet of getter column 10 and vent 54 to a gas cabinet which may form part of the gas distribution network. Each of isolation valves 42 and 44, bypass valve 46, and vent valve 48 is coupled to control unit 38. Temperature sensors disposed in getter column 10, e.g., temperature sensors 34 and 36 shown in FIG. 1, are also coupled to control unit 38.

Control unit 38 measures the temperatures sensed by the temperature sensors in getter column 10 and actuates, e.g., by air actuation, isolation valves 42 and 44, bypass valve 46, and vent valve 48 when certain alarm temperatures are reached or when one of the temperature sensors is destroyed. When the temperature sensor is a thermocouple element, an open thermocouple indicates that the thermocouple element may have been destroyed. Control unit 38 may be any electronic device capable of performing these functions, e.g., microprocessor, microcontroller, computer, or discrete logic, and may be coupled into the existing control computer for the getter-based gas purifier.

Control unit 38 preferably has three alarm levels. At the first alarm level, which occurs when a first alarm temperature is measured, control unit 38 actuates isolation valves 42 and 44 to isolate getter column 10, i.e., to close off both the inlet and outlet of getter column 10, and opens bypass valve 46. At the second alarm level, which occurs when a second alarm temperature is measured, control unit 38 actuates vent valve 48 to vent gas from getter column 10. At the third alarm level, which occurs when a third alarm temperature is reached, control unit 38 closes bypass valve 48. The first alarm temperature is preferably about 10° C. to about 100° C., more preferably about 40° C. to about 60° C., and most preferably about 50° C., above a normal operating temperature of getter column 10. The first alarm level action shuts down the exothermic reaction (if present) by isolating getter column 10. The second alarm temperature is preferably at least about 100° C. above a normal operating temperature of getter column 10. A temperature increase of this magnitude is a reliable indicator that an exothermic reaction has reached a dangerous level. The second alarm level action vents gas to help release impurities and to protect getter column 10 from structural failure. Venting gas protects getter column 10 from structural failure by reducing the internal pressure, which is on the order of 100–150 psig in normal operation, within getter column 10 to prevent unsafe structural conditions due to the high temperatures (near 1000° C.) from the melted getter. Venting will also, in the case of the upper melt zone, flush out the impurities remaining in the inlet tubing with noble gas stored below the melt zone in the getter column. The second alarm level action vents as much gas as possible from getter column 10, e.g., down to about 0–5 psig. The third alarm temperature is preferably at least about 200° C., and more preferably at least about 300° C., above a normal operating temperature of getter column 10. A temperature increase of this magnitude is a reliable indicator that a substantial amount have excess impurities have been introduced into getter column 10. The third alarm level action shuts off the supply of gas to the gas distribution network for the semiconductor fabrication facility so that high impurity gas is not used in the production of integrated circuit devices. The time response to the alarm actions should be quick, e.g., within about 0.5 to 1.5 seconds, because the melting process can cause substantial damage in a matter of a few seconds. To reduce the time response to the alarm actions, the use of an individual solenoid valve for each of isolation valves 42 and 44, bypass valve 46, and vent valve 48 is preferred.

The normal operating temperature of a getter column in an argon gas purifier is about 400° C. Accordingly, the first alarm temperature is preferably within a range of from about 410° C. to about 500° C., more preferably within a range of from about 440° C. to about 460° C., and most preferably about 450° C. The second alarm temperature is preferably at least about 500° C. The third alarm temperature is preferably at least about 600° C., and more preferably at least about 700° C.

The operation of getter-based gas purifier 2 may be summarized as follows. The gas to be purified flows from source 50 through isolation valve 42, pre-heater 56, and into getter column 10, which is heated by heater 58, through an inlet thereof. As the gas flows through getter column 10, the getter material therein sorbs impurities from the gas. The purified gas exits getter column 10 through an outlet thereof and flows through forced air heat exchanger 60, hydrogen removal unit 62, particle filter 64, isolation valve 44, and outlet 52. Control unit 38 continuously or intermittently measures temperatures sensed by the temperature sensors in getter column 10 during the purification process. In the event control unit 38 measures a temperature at or above a first alarm temperature, control unit 38 actuates isolation valves 42 and 44 to isolate getter column 10. When getter column 10 is isolated, the feed gas to be purified, which already has a high purity level, flows directly from source 50 to outlet 52 via bypass valve 46 so that the gas distribution network continues to be supplied with gas. In the event control unit 38 measures a temperature at or above a second alarm temperature, control unit 38 actuates vent valve 48 to vent gas from getter column 10. When vent valve 48 is actuated, gas flows from getter column 10 through manual valve 66, particle filter 68, vent valve 48, check valve 70, and vent 54 to a gas cabinet which may form part of the gas distribution network. In the event control unit 38 measures a temperature at or above a third alarm temperature, control unit 38 closes bypass valve 46 to shut off the supply of gas to the gas distribution network. In addition to being configured to carry out alarm actions when certain temperatures are measured, control unit 38 is preferably further configured to provide "upscale" protection. In other words, in the event control unit 38 determines that a temperature sensor may have been destroyed, e.g., by detecting an open thermocouple, control unit 38 assumes a maximum temperature, e.g., the third alarm temperature, has been reached and carries out the corresponding alarm actions.

Figure 8:
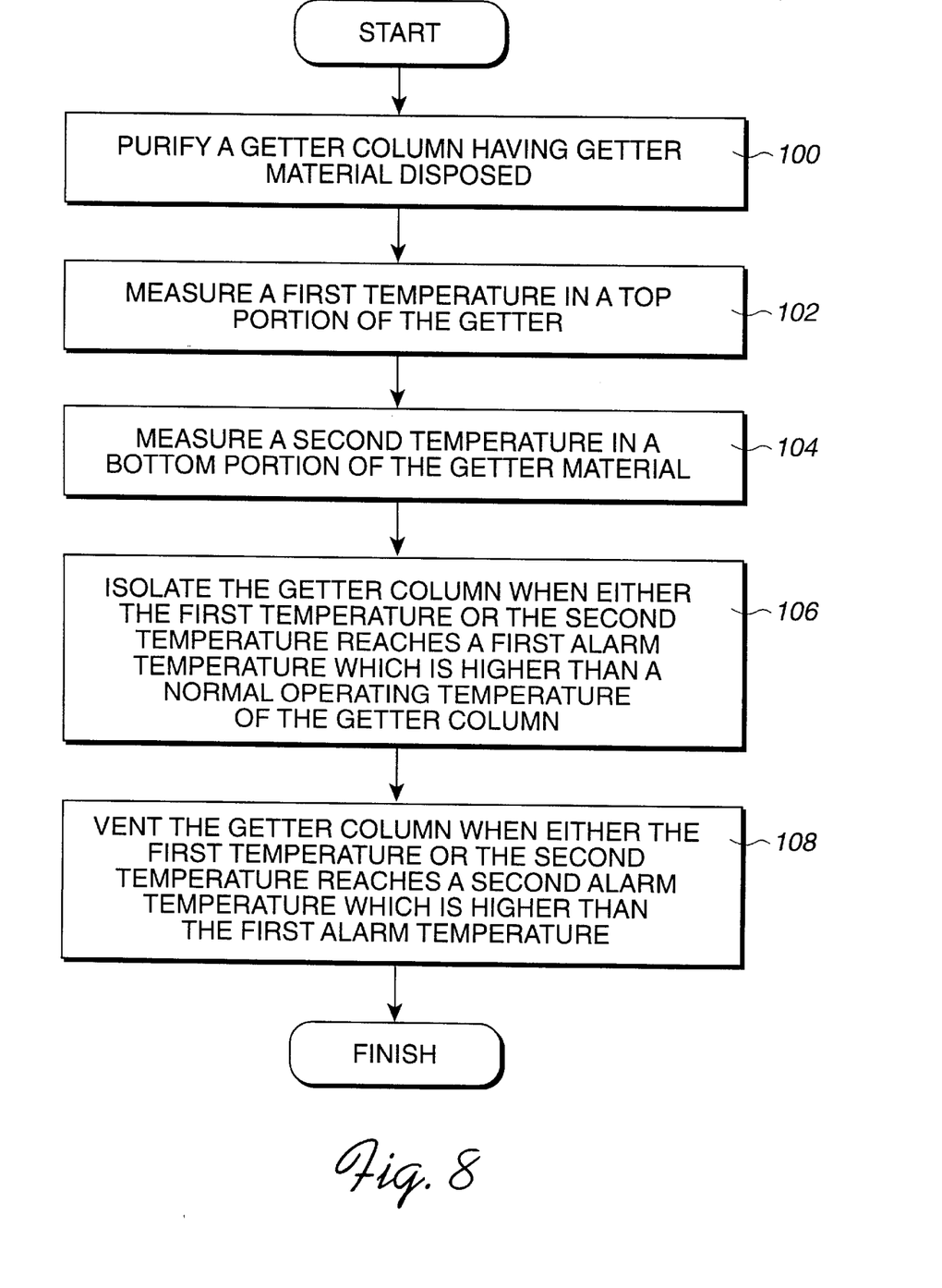
FIG. 8 is a flow diagram of a method of protecting a getter column of the present invention.

FIG. 8 is a flow diagram of a method of protecting a getter column in accordance with the present invention. In step 100 a getter column having getter material disposed therein is provided. Getter column 10 described herein is an example of a getter column suitable for use in step 100. Those skilled in the art will recognize, however, that the method of the present invention is not limited to getter columns having the features of getter column 10. In step 102 a first temperature is measured in a top portion of the getter material. The first temperature may be measured by a control unit which is coupled to a temperature sensor disposed in the getter material as described above for getter column 10. The first temperature is preferably measured from just above 0 inch to just below 3 inches below the top of the getter material, with a preferred range being from about 0.5 inch to about 2.5 inches, and a more preferred range being from about 1 inch to about 2 inches. In step 104 a second temperature is measured in a bottom portion of the getter material. The second temperature may be measured in the same manner in which the first temperature is measured. The second temperature is preferably measured from just above 0 inch to just below 3 inches above the bottom of the getter material, with a preferred range being from about 0.5 inch to about 2.5 inches, and a more preferred range being from about 1 inch to about 2 inches.

In step 106 the getter column is isolated when either the first temperature or the second temperature reaches a first alarm temperature which is higher than a normal operating temperature of the getter column. The getter column may be isolated by actuating isolation valves which prevent gas from entering either the inlet or the outlet of the getter column. As described above, isolating the getter purifier shuts down the exothermic reaction which occurs when high impurity gas enters the getter column. The first alarm temperature is preferably about 10° C. to about 100° C., more preferably about 40° C. to about 60° C., and most preferably about 50° C., above a normal operating temperature of the getter column. In a preferred embodiment in which the getter column is part of an argon gas purifier, the normal operating temperature of the getter column is about 400° C. Accordingly, the first alarm temperature is preferably within a range of from about 410° C. to about 500° C., more preferably within a range of from about 440° C. to about 460° C., and most preferably about 450° C.

In step 108 the getter column is vented when either the first temperature or the second temperature reaches a second alarm temperature which is higher than the first alarm temperature. The getter column may be vented by actuating a vent valve which allows gas to flow out of the getter column. As described above, venting the getter column relieves the internal pressure therein, which is normally about 100–150 psig. This prevents such internal pressure from forcing molten getter material against the containment wall of the getter column and reacting therewith to form a eutectic composition. Venting also helps rid the getter column of excess impurities. The second alarm temperature is preferably at least about 100° C. above a normal operating temperature of the getter column. Accordingly, in the preferred embodiment in which the getter column is part of an argon gas purifier, the second alarm temperature is preferably at least about 500° C.

Figure 9:
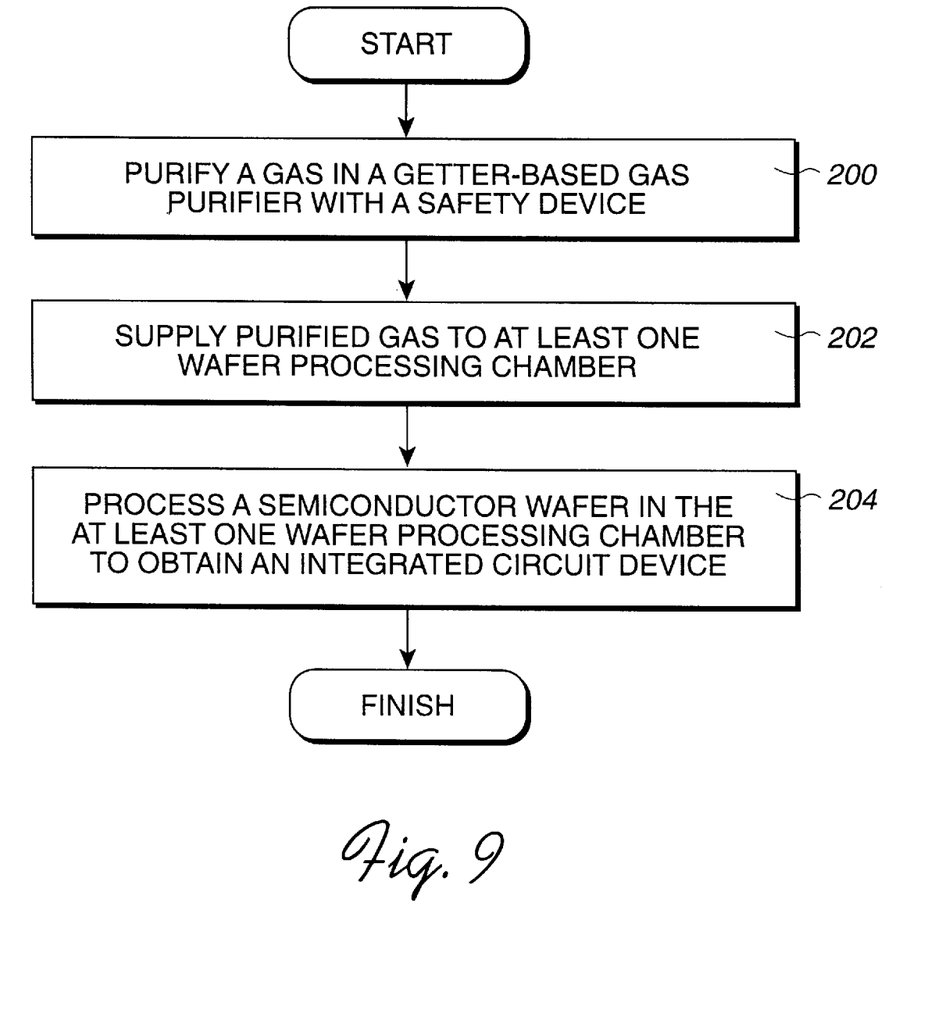
FIG. 9 is a flow diagram of a method of making an integrated circuit device of the present invention.

FIG. 9 is a flow diagram of a method of making an integrated circuit device in accordance with the present invention. In step 200 a gas is purified in a getter-based gas purifier with a safety device. Getter-based gas purifier 2 described herein which includes getter column 10 is an example of a getter-based gas purifier suitable for use in step 200. Those skilled in the art will recognize, however, that the method of the present invention is not limited to getter-based gas purifiers having the features of getter-based gas purifier 2. In step 202 the purified gas is supplied to at least one wafer processing chamber in, e.g., a semiconductor fabrication facility. In step 204 the semiconductor wafer is processed in the at least one wafer processing chamber to obtain an integrated circuit device. As discussed above, processes in which ultrapure Ar or He may be used include, for example, chemical vapor deposition, physical vapor deposition, and ion implantation.

The present invention will now be described with reference to specific examples. It should be borne in mind that the examples given below are merely illustrative of particular applications of the getter-based gas purifier and getter column of the present invention and should in no way be construed to limit the usefulness of the invention in other applications.

EXAMPLE 1

A Megatorr® gas purifier (commercially available from SAES Pure Gas, Inc. of San Luis Obispo, Calif.) was used as a test bed. The getter column included a 5 inch diameter vessel containing a bed of 4 kilograms of virgin St 707™ getter material, and was provided with a quartz sleeve or liner near the predicted melt zone. More particularly, a cylindrical quartz liner having a length of about 4 inches was disposed in the vessel so that the top end thereof was about ½ inch above the top of the getter bed. A 1 inch layer of 0.125 inch diameter 316 stainless steel shot separated the bed of getter material from the bed support. Three thermocouples (TC1–TC3) were centrally disposed at 1 inch increments below the top surface of the getter bed. A fourth thermocouple (TC4) was disposed 2 inches below the top surface of the getter bed and offset from the center of the vessel. A control unit coupled to TC1 and TC2 was configured to isolate the getter column when a temperature of 450° C. was measured from TC1 and to vent the getter column when a temperature of 500° C. was measured from TC2.

The getter column was heated to 400° C. and a flow of argon, which was preheated to 400° C., was established through the column at 20 m³/hour and a line pressure of 110–120 psig. The purifier was then switched into bypass mode in which the getter column was isolated and the argon gas flow bypassed the getter column. At this point, the argon feed gas was switched over to 100% nitrogen from a cylinder located upstream of the getter column. The purifier was then switched back into purify mode and the pure nitrogen gas entered the getter column through an inlet thereof.

About 5.6 seconds after the pure nitrogen gas entered the getter column, the control unit measured a temperature of 450° C. from TC1 and isolated the getter column by actuating isolation valves. The actuation of the isolation valves prevented any additional nitrogen gas from entering the getter column. About 6 seconds after the pure nitrogen gas entered the getter column, the control unit measured a temperature of 500° C. from TC2 and vented the getter column by actuating a vent valve in flow communication with the inlet of the getter column. The control unit measured a maximum temperature of over 1,100° C. from TC1 before it was destroyed approximately 9.2 seconds into the test. The control unit did not measure a temperature above 450° C. from TC3 before it was destroyed approximately 10 seconds into the test. The location of TC3 (3 inches below the top surface of the getter bed) corresponds to the location of prior art thermocouples.

The getter column survived the introduction of the pure nitrogen gas without breach of containment of the getter material. The getter material melted and formed a solid plug located about 2 inches below the top surface of the getter bed. The quartz sleeve or liner survived intact.

EXAMPLE 2

The procedure described above in Example 1 was repeated to introduce 100% bone dry air, which contains about 20% oxygen, into the getter column. The equipment used was the same as in Example 1 except for the location of the thermocouples. Two thermocouples (TC1 and TC2) were centrally disposed at 1 inch increments below the top surface of the getter bed. Two other thermocouples (TC3 and TC4) were also disposed at 1 inch increments below the top surface of the getter bed were offset from the center of the vessel on a 3.31 bolt circle. Again, a cylindrical quartz liner having a length of about 4 inches was disposed in the vessel so that the top end thereof was about ½ inch above the top of the getter bed. The control unit coupled to TC1 and TC2 was configured to isolate the getter column when a temperature of 450° C. was measured from TC1 and to vent the getter column when a temperature of 500° C. was measured from TC2.

The air was injected into the getter column with a combination of a high pressure cylinder, a regulator, and tubing. About 6 seconds after the air entered the getter column, the control unit measured a temperature of 450° C. from TC1 and isolated the getter column by actuating isolation valves. All thermocouples melted within 1 second of the getter column being isolated. The control unit actuated the vent valve when TC2 was destroyed. Although both TC1 and TC3 were located 1 inch below the top surface of the getter bed, TC3 responded to the thermal event, i.e., the onset of the exothermic reaction, about 2 seconds before TC1. It is believed that the difference in response time between TC1 and TC3 was caused by the inlet filter which channeled the incoming gas to the outer radial portion of the getter material and, consequently, the exothermic reaction started there.

The getter column survived the introduction of 100% bone dry air without breach of containment of the getter material. As in Example 1, the getter material melted and formed a solid plug located about 2 inches below the top surface of the getter bed. In addition, tightly fused getter material was observed directly below the melted portion of the getter material. The quartz liner protected the wall of the vessel from any substantial damage.

EXAMPLE 3

Example 2 was repeated using a different vessel to determine the effect of aged getter material. The vessel used in this example was the same as that used in Example 2 except for the location of the thermocouples. Five thermocouples (TC1–TC5) were disposed at 1 inch increments below the top surface of the getter bed, with each thermocouple being offset from the center of the vessel. The thermocouples were located in the outer radial portion of the getter material for a quicker response in view of the channeling of the incoming gas caused by the inlet filter. The alarm actions were triggered by TC1 and TC2 as in Examples 1 and 2.

The getter material was aged by injecting a 50/50 blend of $N_2$ and $O_2$ into the getter column at a gas flow rate of 20 $m^3$/hour. The getter material was exposed to an amount of $N_2$ and $O_2$ impurities equivalent to two years of service life (based on a level of 2 ppm for each impurity). After the getter material was aged, 100% bone dry air was injected into the getter column.

About 18 seconds after the air entered the getter column, all of the thermocouples melted which triggered the alarm actions. Upon inspection, the getter material was heavily oxidized and had fused together in a large clump, but not as a solid plug. The getter material was fragile and could be broken apart with a screwdriver.

The getter column survived the introduction of 100% bone dry air without breach of containment of the aged getter material. Although the quartz liner shattered, the vessel integrity was good and there were no signs of structural failure. The shattering of the quartz liner may have been caused by the thermal loading or the process of extracting the getter material from the vessel.

EXAMPLE 4

The procedure described above in Example 1 was modified to introduce 100% nitrogen into the bottom of the getter column through an outlet thereof. The equipment used was the same as in Example 1 except that the location of the nitrogen gas facility was changed and a different vessel was used. The location of the nitrogen gas facility was moved from upstream of the getter column to downstream of the getter column. The vessel was again the same as the vessel used in Example 1 except for the location of the thermocouples and the amount of the stainless steel shot used. Four thermocouples (TC1–TC4) were disposed at 0.5 inch increments above the bottom surface of the getter bed and the underlying layer of stainless steel shot. The thermocouples were arranged so that TC1 was 2 inches above the bottom surface of the getter bed and TC4 was 0.5 inch above the bottom surface of the getter bed. TC4 was the trigger for the isolation alarm action and TC3 was the trigger for the vent alarm action. The cylindrical quartz liner having a length of 4 inches was disposed in the vessel so that the bottom end thereof was about ½ inch below the bottom surface of the getter bed, but above the bed support.

About 10.5 seconds after the pure nitrogen gas entered the bottom of the getter column through the outlet thereof, the thermocouple melted which triggered the alarm actions. TC4 located 2 inches above the bottom surface of the getter bed had the quickest response time to the thermal event. The control unit measured a rapid rise in temperature to over 1,300° C. for TC4 starting approximately 4 seconds after the pure nitrogen gas entered through the outlet of the getter column. Thus, TC4 indicated the thermal event about 6.5 seconds before the thermocouple melted. It is believed that the maximum temperature occurred the fastest at a distance 2 inches above the bottom surface of the getter bed because the cold gas entering though the outlet quenched the exothermic reaction closer to the bottom surface of the getter bed.

The getter column survived the introduction of 100% nitrogen through the outlet thereof without breach of containment of the getter material. Upon inspection of the vessel, all of the getter material had formed a solid plug of melted getter material. Below the solid plug, a layer of fused stainless steel shot having a thickness of 0.25 to 0.375 inch was observed. Thus, the layer of stainless steel shot effectively protected the bed support from substantial damage. The quartz liner protected the wall of the vessel from any substantial damage.

The getter-based gas purifier of the present invention has been described herein in connection with the purification of noble gases such as Ar and He (see, e.g., FIG. 1). It is believed that the getter-based gas purifier of the present invention also may be applicable to the purification of other gases, e.g., $H_2$ and $N_2$.

While this invention has been described in terms of several preferred embodiments, there are alterations, permutations, and equivalents which fall within the scope of this invention. If should also be noted that there are many ways of implementing the semiconductor manufacturing system, getter-based gas purifier, getter column, and methods of the present invention. It is therefore intended that the following claims be interpreted as including all such alterations, permutations, and equivalents as fall within the true spirit and scope of the present invention.

We claim:

1. A semiconductor manufacturing system, comprising:
 a getter-based gas purifier coupled in flow communication with a gas distribution network for a semiconductor fabrication facility, said gas distribution network supplying purified gas to at least one wafer processing chamber in said semiconductor fabrication facility, wherein said gas purifier comprises:
 a getter column having a metallic vessel with an inlet, an outlet, and a containment wall extending between said inlet and said outlet, the getter column further having a first high melting point, nonmetallic liner disposed in the vessel such that at least some of the top portion of getter material disposed in said vessel is separated from the containment wall of the vessel and a second high melting point, nonmetallic liner disposed in the vessel such that at least some of the bottom portion of the getter material is separated from the containment wall of the vessel;
 a first temperature sensor disposed in a top portion of said getter material, said first temperature sensor being located in a melt zone; and
 a second temperature sensor disposed in a bottom portion of said getter material, said second temperature sensor being located in a melt zone.

2. The system of claim 1, wherein the first and second high melting point, nonmetallic liners are comprised of a ceramic material.

3. The system of claim 1, wherein the first and second high melting point, nonmetallic liners are comprised of a material selected from the group consisting of quartz, zirconia ($ZrO_2$), SiC, SiN, and $Al_2O_3$.

4. The system of claim 1, wherein the gas purifier further includes a control unit coupled to the first and second temperature sensors for measuring temperatures sensed by the first and second temperature sensors, said control unit actuating at least one isolation valve to isolate the getter column when a first alarm temperature is measured and actuating a vent valve to vent gas from the getter column when a second alarm temperature is measured.

5. The system of claim 1, wherein the first and second temperature sensors are thermocouple elements.

6. A semiconductor manufacturing system, comprising:
 a getter-based gas purifier coupled in flow communication with a gas distribution network for a semiconductor fabrication facility, said gas distribution network supplying purified gas to at least one wafer processing chamber in said semiconductor fabrication facility, wherein said gas purifier comprises:
 a getter column having a metallic vessel with an inlet, an outlet, and a containment wall extending between said inlet and said outlet;
 getter material disposed in said vessel;
 a first high melting point, nonmetallic liner disposed in said vessel such that a top portion of said getter material is separated from said containment wall of said vessel;
 a first temperature sensor disposed in said top portion of said getter material, said first temperature sensor being located about 0.5 inch to about 2.5 inches below the top surface of the getter material;
 a second high melting point, nonmetallic liner disposed in said vessel such that a bottom portion of said getter material is separated from said containment wall of said vessel; and
 a second temperature sensor disposed in said bottom portion of said getter material, said second temperature sensor being located about 0.5 inch to about 2.5 inches above the bottom surface of the getter material.

7. The system of claim 6, wherein the first and second high melting point, nonmetallic liners are comprised of a ceramic material.

8. The system of claim 6, wherein the first and second high melting point, nonmetallic liners are comprised of a material selected from the group consisting of quartz, zirconia ($ZrO_2$), SiC, SiN, and $Al_2O_3$.

9. The system of claim 6, wherein the getter column further includes:
 a porous support member disposed in the vessel, said support member supporting the getter material; and
 a barrier material disposed on said support member, said barrier material separating the getter material from the support member.

10. The system of claim 9, wherein the support member is comprised of a metallic plate and the barrier material is comprised of stainless steel shot.

11. The system of claim 6, wherein the gas purifier further includes a control unit coupled to the first and second temperature sensors for measuring temperatures sensed by the first and second temperature sensors, said control unit actuating at least one isolation valve to isolate the getter column when a first alarm temperature is measured and actuating a vent valve to vent gas from the getter column when a second alarm temperature is measured.

12. The system of claim 6, wherein the first and second temperature sensors are thermocouple elements.

13. A semiconductor manufacturing system, comprising:
 a getter-based gas purifier coupled in flow communication with a gas distribution network for a semiconductor fabrication facility, said gas distribution network supplying purified gas to at least one wafer processing chamber in said semiconductor fabrication facility, wherein said gas purifier comprises:
 a setter column having a metallic vessel with an inlet, an outlet, and a containment wall extending between said inlet and said outlet, wherein said getter column further includes an upper high melting point, nonmetallic liner disposed in said vessel such that at least some of the top portion of said getter material is separated from said containment wall of said vessel;
 getter material disposed in said vessel;
 a first temperature sensor that is a thermocouple element, the first temperature sensor disposed in a top portion of said getter material, said first temperature sensor being located a distance below a top surface of said getter material, said distance being from just above 0 inches to just below 3 inches;

a second temperature sensor that is a thermocouple element, the second temperature sensor disposed in a bottom portion of said getter material; said second temperature sensor being located a distance above a bottom surface of said getter material, said distance being from just above 0 inches to just below 3 inches; and a lower high melting point, nonmetallic liner disposed in said vessel such that at least some of said bottom portion of said getter material is separated from said containment wall of said vessel.

14. The system of claim 13, wherein the upper and lower high melting point, nonmetallic liners are comprised of a ceramic material.

15. The system of claim 13, wherein the upper and lower high melting point, nonmetallic liners are comprised of a material selected from the group consisting of quartz, zirconia ($ZrO_2$), SiC, SiN, and $Al_2O_3$.

16. A semiconductor manufacturing system, comprising:

a getter-based gas purifier coupled in flow communication with a gas distribution network for a semiconductor fabrication facility said gas distribution network supplying purified gas to at least one wafer processing chamber in said semiconductor fabrication facility, wherein said gas purifier comprises:

a getter column having a metallic vessel with an inlet, an outlet, and a containment wall extending between said inlet and said outlet;

getter material disposed in said vessel;

a first temperature sensor that is a thermocouple element, the first temperature sensor disposed in a top portion of said getter material, said first temperature sensor being located a distance below a top surface of said getter material, said distance being from just above 0 inches to just below 3 inches;

a second temperature sensor that is a thermocouple element, the second temperature sensor disposed in a bottom portion of said getter material; said second temperature sensor being located a distance above a bottom surface of said getter material, said distance being from just above 0 inches to just below 3 inches;

a lower high melting point. nonmetallic liner disposed in said vessel such that at least some of said bottom portion of said getter material is separated from said containment wall of said vessel; and a control unit coupled to said first and second temperature sensors for measuring temperatures sensed by said first and second temperature sensors, said control unit actuating at least one isolation valve to isolate said getter column when a first alarm temperature is measured and actuating a vent valve to vent gas from said getter column when a second alarm temperature is measured.

17. A getter-based gas purifier, comprising:

a getter column having a metallic vessel with an inlet, an outlet, and a containment wall extending between said inlet and said outlet, said vessel having getter material disposed therein;

a first isolation valve in flow communication with said inlet of said vessel;

a vent valve in flow communication with said inlet of said vessel;

a second isolation valve in flow communication with said outlet of said vessel;

a first temperature sensor disposed in a top portion of said getter material;

a second temperature sensor disposed in a bottom portion of said getter material; and a control unit coupled to said first and second temperature sensors, said first and second isolation valves, and said vent valve, wherein said control unit measures temperatures sensed by said first and second temperature sensors and, when a temperature above a first alarm temperature is measured, actuates said first and second isolation valves to isolate said getter column and, when a temperature above a second alarm temperature is measured, actuates said vent valve to vent gas from said getter column.

18. The gas purifier of claim 17, wherein the first isolation valve is in flow communication with a source of feed gas to be purified, the second isolation valve is in flow communication with an outlet for purified gas, and the gas purifier further includes a bypass valve in flow communication with said source of feed gas and said outlet for purified gas, wherein the control unit opens said bypass valve when a temperature above the first alarm temperature is measured and, when a temperature above a third alarm temperature is measured, closes said bypass valve.

19. The gas purifier of claim 17, wherein the first temperature sensor is located about 0.5 inch to about 2.5 inches below a top surface of the getter material and the second temperature sensor is located about 0.5 inch to about 2.5 inches above a bottom surface of the getter material.

20. The gas purifier of claim 17, wherein the first temperature sensor is located about 1 inch to about 2 inches below a top surface of the getter material and the second temperature sensor is located about 1 inch to about 2 inches above a bottom surface of the getter material.

21. The gas purifier of claim 17, wherein the getter column further includes a first high melting point, nonmetallic liner disposed in the vessel such that at least some of the top portion of the getter material is separated from the containment wall of the vessel and a second high melting point, nonmetallic liner disposed in the vessel such that at least some of the bottom portion of the getter material is separated from the containment wall of the vessel.

22. The gas purifier of claim 21, wherein the first and second high melting point, nonmetallic liners are comprised of a ceramic material.

23. The gas purifier of claim 21, wherein the first and second high melting point, nonmetallic liners are comprised of a material selected from the group consisting of quartz, zirconia ($ZrO_2$), SiC, SiN, and $Al_2O_3$.

24. The gas purifier of claim 17, wherein the getter column further includes:

a porous support member disposed in the vessel, said support member supporting the getter material; and a barrier material disposed on said support member, said barrier material separating the getter material from the support member.

25. The gas purifier of claim 24, wherein the support member is a plate comprised of stainless steel and the barrier material is comprised of stainless steel shot.

26. The gas purifier of claim 17, wherein the first and second temperature sensors are thermocouple elements.

27. The gas purifier of claim 17, wherein the first alarm temperature is about 10° C. to about 100° C. above a normal operating temperature of the getter column and the second alarm temperature is at least about 100° C. above a normal operating temperature of the getter column.

28. The gas purifier of claim 18, wherein the first alarm temperature is about 10° C. to about 100° C. above a normal operating temperature of the getter column, the second alarm temperature is at least about 100° C. above a normal operating temperature of the getter column, and the third alarm temperature is at least about 200° C. above a normal operating temperature of the getter column.

29. The gas purifier of claim 17, wherein the first alarm temperature is about 40° C. to about 60° C. above a normal operating temperature of the getter column and the second alarm temperature is at least about 100° C. above a normal operating temperature of the getter column.

30. The gas purifier of claim 18, wherein the first alarm temperature is about 40° C. to about 60° C. above a normal operating temperature of the getter column, the second alarm temperature is at least about 100° C. above a normal operating temperature of the getter column, and the third alarm temperature is at least about 300° C. above a normal operating temperature of the getter column.

31. The gas purifier of claim 17, wherein the first alarm temperature is about 410° C. to about 500° C. and the second alarm temperature is at least about 500° C.

32. The gas purifier of claim 18, wherein the first alarm temperature is about 410° C. to about 500° C., the second alarm temperature is at least about 500° C., and the third alarm temperature is at least about 600° C.

33. The gas purifier of claim 17, wherein the first alarm temperature is about 440° C. to about 460° C. and the second alarm temperature is at least about 500° C.

34. The gas purifier of claim 18, wherein the first alarm temperature is about 440° C. to about 460° C., the second alarm temperature is at least about 500° C., and the third alarm temperature is at least about 700° C.

* * * * *

UNITED STATES PATENT AND TRADEMARK OFFICE
CERTIFICATE OF CORRECTION

PATENT NO. : 6,068,685
DATED : May 30, 2000
INVENTOR(S) : D'Arcy H. Lorimer and Charles H. Applegarth Page 1 of 1

It is certified that error appears in the above-identified patent and that said Letters Patent is hereby corrected as shown below:

Title page,
Item [56], References Cited, FOREIGN PATENT DOCUMENTS,
Reads ""2 177 079 1/1987 United Kingdom". it should read -- 2 177 079A 1/1987 United Kingdom --;
Reads ""2 177 080 1/1987 United Kingdom". it should read -- 2 177 080A 1/1987 United Kingdom --;

Column 7,
Line 4, reads "located at a point which is a distance D, below the top of." it should read -- located at a point which is a distance D1, below the top of --;

Column 16,
Line 53, reads "a setter column having a metallic vessel with an inlet". it should read -- a getter column having a metallic vessel with an inlet --;

Column 17,
Line 22, reads, "fabrication facility said gas distribution network sup-". it should read -- fabrication facility, said gas distribution network sup- --.
Line 43, reads, "a lower high melting point. nonmetallic liner disposed". it should read -- a lower high malting point, nonmetallic liner disposed --.

Signed and Sealed this

Twenty-third Day of April, 2002

Attest:

JAMES E. ROGAN
*Director of the United States Patent and Trademark Office*

*Attesting Officer*